United States Patent
Kurosaka et al.

[11] Patent Number: 5,942,033
[45] Date of Patent: Aug. 24, 1999

[54] APPARATUS AND METHOD FOR PULLING UP SINGLE CRYSTALS

[75] Inventors: Shoei Kurosaka; Hiroshi Inagaki; Shigeki Kawashima; Junsuke Tomioka, all of Kanagawa, Japan

[73] Assignee: Komatsu Electronic Metals Co., Ltd., Kanagawa, Japan

[21] Appl. No.: 09/048,302

[22] Filed: Mar. 26, 1998

[30] Foreign Application Priority Data

Mar. 26, 1997 [JP] Japan ..................................... 9-089987

[51] Int. Cl.[6] ................................................. C30B 15/24
[52] U.S. Cl. ............................. 117/13; 117/218; 117/911
[58] Field of Search .............................. 117/13, 200, 218, 117/900, 911

[56] References Cited

U.S. PATENT DOCUMENTS

| | | | |
|---|---|---|---|
| 3,191,924 | 6/1965 | Haus | 117/911 |
| 5,126,113 | 6/1992 | Yamagishi et al. | 117/911 |
| 5,196,086 | 3/1993 | Kida et al. | 117/911 |

FOREIGN PATENT DOCUMENTS

| | | | |
|---|---|---|---|
| 362288191 | 12/1987 | Japan | 117/911 |
| B-5-65477 | 9/1993 | Japan . | |
| B-7-515 | 1/1995 | Japan . | |
| B-7-103000 | 11/1995 | Japan . | |

*Primary Examiner*—Felisa Hiteshew
*Attorney, Agent, or Firm*—Sughrue, Mion, Zinn, MacPeak & Seas, PLLC

[57] ABSTRACT

A crystal-clamping fixture 30 is suspended by a pulling up mechanism 1 through the use of wires. The crystal-clamping fixture 30 includes a box 31 and a plurality of holding rods 32. The box 31 has two openings formed on its top and bottom sides. The reduced portion 2a, the enlarged portion 2b and the necked portion 2c formed beneath the seed crystal 5 are allowed to penetrate through the two openings during the pulling up operation. A plurality of "S" shaped slots 31a, 31b are formed on the lateral sides of the box 31. The holding rods 32 capable of rotating along the path of the "S" shaped slots 31a, 31b are horizontally disposed within the box 31 by inserting their two end portions through the "S" shaped slots 31a, 31b. The holding rods kept restrained at the upper ends of the "S" shaped slots are pushed out by the conic surface formed at the upper part of the enlarged portion 2b and rotate and descend to reach the lower ends of the "S" shaped slots. At the time the crystal-clamping fixture 30 is directed to ascend a small distance, then the holding rods 32 contact the conic surface formed between the enlarged portion 2b and the necked portion 2c to clamp the single crystal 2.

7 Claims, 6 Drawing Sheets

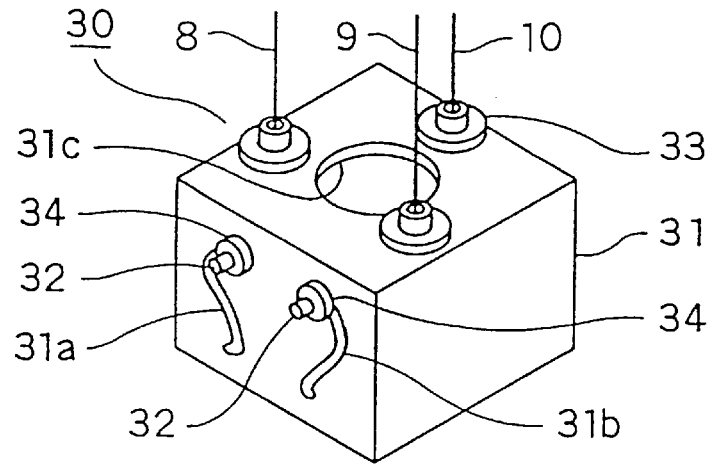
Fig. 2
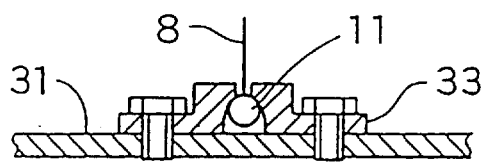
Fig. 3
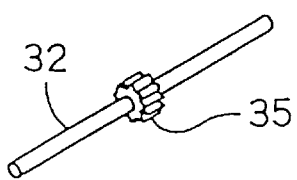 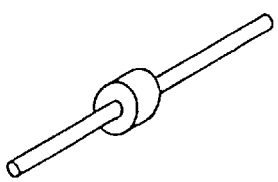 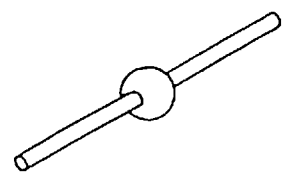
Fig. 4a  Fig. 4b  Fig. 4c

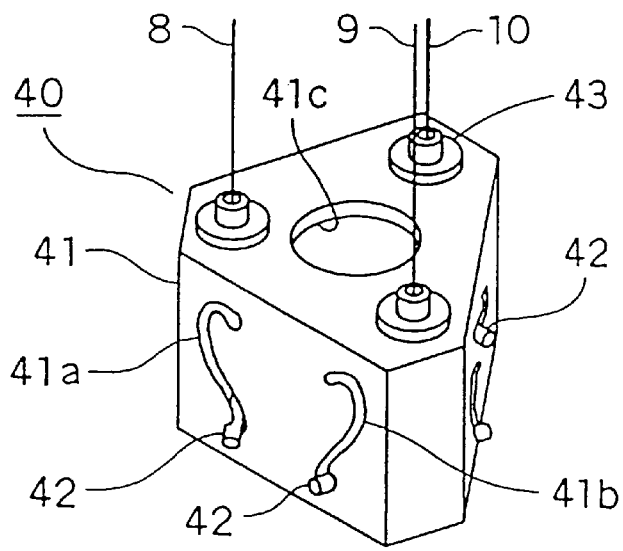
Fig. 5
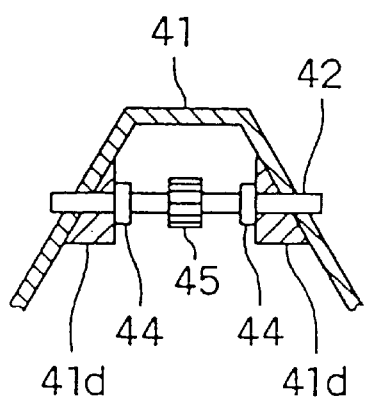 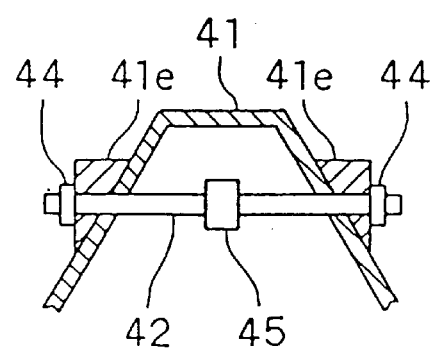
Fig. 6a  Fig. 6b

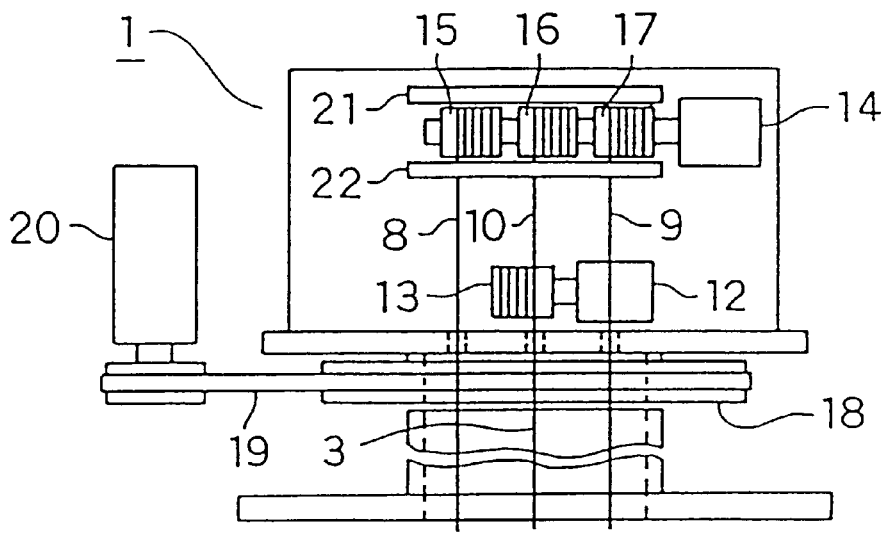
Fig. 7
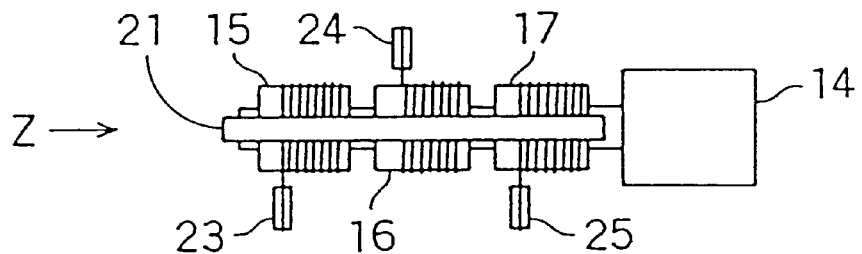
Fig. 8
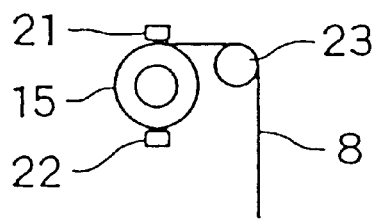 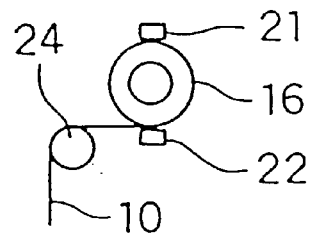
Fig. 9a  Fig. 9b

APPARATUS AND METHOD FOR PULLING UP SINGLE CRYSTALS

BACKGROUND OF THE INVENTION

1. Field of the Invention

This invention relates to an apparatus and a method for pulling up single crystals, said apparatus of which is suitable for installation on a single-crystal manufacturing apparatus utilizing the CZ (Czochralski) method, especially suitable for the process of pulling up heavy single crystals.

2. Description of the Related Art

Conventionally, single crystal silicon is produced by the CZ method. In the CZ method, polycrystalline silicon is deposited into a quartz crucible of a single-crystal manufacturing apparatus, then the polycrystalline silicon is heated to melt by way of heaters disposed around the quartz crucible. Subsequently, a seed crystal installed within a seed holder is dipped into the melt. Afterward, the seed holder and the quartz crucible are respectively driven to rotate in the same or reverse directions. At the same time, the seed holder is pulled up to grow a single crystal with predetermined diameter and length.

In the seed crystal, dislocation will arise due to the heat shock occurring at the time of dipping it into melt. In order to stop propagation of this dislocation from the seed crystal to single crystal to be grown, a reduced portion with diameter from 3 to 5 mm is grown beneath the seed crystal so as to release the dislocation to the surface of thereduced portion. Making certain that the propagation of dislocation has been stopped, a shoulder is formed and the single crystal is enlarged until it reaches a predetermined diameter. Then, the pulling up operation is shifted to that of forming the body of the single crystal.

In recent years, with the enlargement of single crystals, the weight of an individual single crystal has increased, and the robustness of the reduced portion is reaching a practical limit. To solve the problem, as shown in FIG. 11, an enlarged portion 2b and a necked portion 2c with a diameter smaller than that of the enlarged portion 2b are formed between the reduced portion 2a and the shoulder 2d when the propagation of dislocation has been stopped by way of the reduction process. Since a buttress supports most of the weight of the single crystal 2, breakage of the reduced portion 2a can be prevented. Furthermore, dropping of the single crystal 2 can also be prevented, even if the reduced portion 2a breaks. For example, in the single-crystal pulling up apparatus disclosed in J P-B (Japanese Patent Publication) 5-65477, a clamp arm capable of being driven to open or close is engaged with the necked portion of a single crystal so as to suspend the single crystal. Furthermore, in the single-crystal pulling up apparatus disclosed in J P JP-B 7-515, a plurality of claws retained at a predetermined angle are provided at the lower end of an engaging holder capable of being driven to ascend or descend. The claws are engaged with the necked portion of a single crystal so as to suspend the single crystal. In addition, in the single-crystal pulling up apparatus disclosed in J P-B 7-103000, a plurality of claws engaging with the necked portion of a single crystal are provided. The single crystal is suspended by utilizing a plurality of holding levers capable of being driven to open or to close by their ascending or descending movement and a ring used for preventing opening of the holding levers.

However, in the single-crystal pulling up apparatus disclosed in J P-B 5-65477, the clamp arm will be driven to open when the weight of the single crystal increases to the point where there exists a danger of dropping of the single crystal during pulling up operation. In the single-crystal pulling up apparatuses disclosed in J P-B 7-515 and J P-B 7-103000, dropping of the single crystal being pulled up will not happen. However, the seed holders, the reduced portions, and the necked portions are embraced by a clamping means installed and suspended above them, therefore the holders or holding levers are inevitably long. Furthermore, the holders or holding levers have to be kept stationary at a location above the seed crystal during the formation of the reduced portion. Due to the foregoing reasons, the pulling up stroke of single crystals is shortened. Accordingly, the length of single crystals along their longitudinal axis is restrained and the clamping means becomes bulky.

SUMMARY OF THE INVENTION

In view of the above disadvantages, the object of the present invention is to provide an apparatus and a method for pulling up single crystals, which are in response to the weight increase of semiconductor single crystal produced by the CZ method. According to this invention, a clamping apparatus capable of holding the necked portion formed beneath the reduced portion firmly is provided without restraining the length of single crystals along their longitudinal axis.

To achieve the above object, the single-crystal pulling up apparatus according to this invention comprises: a crystal-clamping fixture including a box and a plurality of holding rods; the box having two openings formed respectively on its top and bottom sides, "S" shaped slots formed on its lateral sides, and a pulling up/lowering means for pulling up or lowering itself, during the pulling up operation; each of the holding rods being horizontally disposed within the box by inserting their two end portions through the "S" shaped slots in a manner capable of rotating along the path of the "S" shaped slots.

Furthermore, the crystal-clamping fixture according to this invention is characterized in that the paths of the "S" shaped slots are designed in a manner that holding rods will not interfere with the enlarged portion and the necked portion of the single crystal being pulled up when the holding rods descend along the paths, each path connecting an upper pocket where a holding rod is kept stationary and a lower pocket where a holding rod clamps the single crystal being pulled up.

Furthore, the crystal-clamping fixture according to this invention is characterized in that the holding rods are kept at a horizontal attitude and positioning means for preventing the change in axial directions are disposed on the box and the holding rods.

Furthermore, the crystal-clamping fixture according to this invention is characterized in that the holding rods are provided with any one kind of collar having radial protrusions, cylindrical shape, or spherical shape, affixed on their middle portions; the collars being used for contacting and clamping the single crystal being pulled up at the conic surface formed between the enlarged portion and the necked portion of the single crystal.

Furthermore, in the crystal-clamping fixture according to this invention is characterized in that the raising/lowering means is connected with the box through a spherical surface. That is to say that the pulling up/lowering means is connected with the box through a connecting portion having spherical surface slidablely Furthermore, the method for pulling up single crystals according to this invention is characterized in that, in the process of manufacturing semiconductor single crystals by the CZ method, subsequent to the dipping of the seed crystal into the melt to form a reduced portion, an enlarged portion and a necked portion are consecutively formed, then a plurality of holding rods kept at the upper pockets of the "S" shaped slots are pushed downward to contact the conic surface formed at the upper part of the enlarged portion, after the holding rods have moved to the lower pockets of the "S" shaped slots the holding rods are directed to contact the conic surface formed between the enlarged portion and the necked portion of the single crystal by raising the crystal-clamping fixture.

According to the structure of the apparatus of this invention for pulling up single crystals, the holding rods disposed in the box of the crystal-clamping fixture are constantly kept at a horizontal attitude and capable of rotating along the path of the "S" shaped slots. In addition, the holding rods can be smoothly shifted from the upper pockets at the upper ends of the "S" shaped slots to the lower pockets at the upper ends of the "S" shaped slots without interfering with the enlarged portion and the necked portion of the single crystal ascending and entering the box. Furthermore, the positioning means can prevent the change in axial directions of the holding rods, therefore the collars affixed on the middle portions of the holding rods can properly contact the conic surface of the enlarged portion. Besides, the pulling up/lowering means is connected with the box through a connecting portion having spherical surface, therefore it is quite easy to take the balance of the crystal-clamping fixture.

Furthermore, according to the method in accordance with this invention for pulling up single crystals, the crystal-clamping fixture is kept unmoved at a preset location to wait the consecutive formations of the enlarged portion and the necked portion. Thereafter, at the time that the conic surface of the upper part of the enlarged portion ascends and enters the box to contact the holding rods due to the pulling up of the single crystal, the holding rods are pushed and rotate downward by their own weight along the "S" shaped slots to the lower pocket of the "S" shaped slots. Then, the holding rods will contact with the conic surface formed between the enlarged portion and the necked portion if the crystal-clamping fixture is raised a slight distance. Thus, the holding rods can clamp the single crystal.

BRIEF DESCRIPTION OF THE DRAWINGS

The present invention can be more fully understood from the subsequent detailed description and examples with reference to the accompanying drawings, wherein:

FIG. 2 is a perspective view showing the structure of a first embodiment of the crystal-clamping fixture according to this invention;

FIG. 3 is a partial cross-sectional view showing the structure of the upper portion of the crystal-clamping fixture according to this invention;

FIG. 4a is a perspective view showing a collar having radial protrusions affixed to the middle portion of a holding rod;

FIG. 4b is a perspective view showing a collar having cylindrical shape affixed to the middle portion of a holding rod;

FIG. 4c is a perspective view showing a collar having spherical shape affixed to the middle portion of a holding rod;

FIG. 5 is a perspective view showing the structure of a second emodiment of the crystal-clamping fixture according to this invention;

FIG. 6a is a partial cross-sectional view showing the structure of the crystal-clamping fixture show in FIG. 5, wherein protrusions are formed on the inside wall thereof;

FIG. 6b is a partial cross-sectional view showing the structure of the crystal-clamping fixture shown in FIG. 5, wherein protrusions are formed on the outside wall thereof;

FIG. 7 is a schematic cross-sectional view showing an outline structure of a pulling up mechanism according to this invention;

FIG. 8 is a top view showing the structure of fixture winding-up drums for pulling up the crystal-clamping fixture;

FIG. 9a is a side view along the Z arrow of FIG. 8, showing the structure of the fixture winding-up drums for pulling up the crystal-clamping fixture shown in FIG. 8, wherein two fixture winding-up drums are installed at two ends thereof;

FIG. 9b is a side view along the Z arrow of FIG. 8, showing the structure of the fixture winding-up drums for pulling up the crystal-clamping fixture shoe in FIG. 8, wherein one fixture winding-up drum is installed at the middle portion thereof;

DETAILED DESCRIPTION OF THE PREFERRED EMBODIMENT

Figure 1:
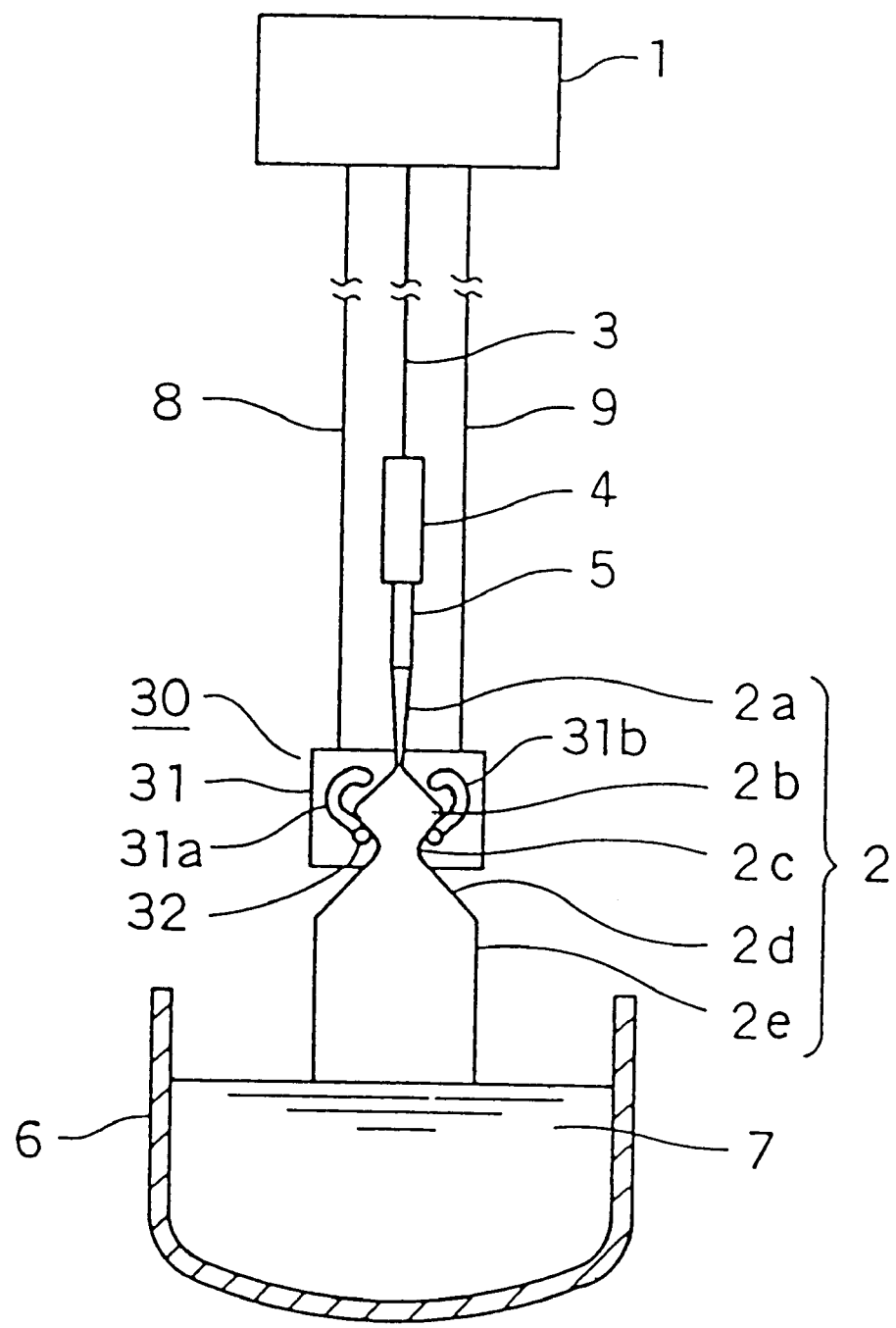
FIG. 1 is a schematic cross-sectional view showing an outline structure of the single-crystal pulling up apparatus according to this invention.

The ebodiments of the single-crystal pulling up apparatus according to this invention are described hereinafter with reference to the drawings. FIG. 1 is a schematic cross-sectional view showing an outline structure of the single-crystal pulling up apparatus. As shown in FIG. 1, a pulling up mechanism 1 is disposed on the upper end of the single-crystal pulling up apparatus. The pulling up-mechanism 1 is provided with means for rotating the single crystal 2 and a crystal-clamping fixture 30 and simultansously pulling up them upward. A seed holder 4 is suspended at the lower end of a single-crystal pulling up wire 3, which is directed to ascend or descend by the pulling up mechanism 1. After a seed crystal 5 installed within the seed holder 4 has been dipped into the melt 7 stored in a quartz crucible 6, the seed holder 4 is driven to rotate so as to consecutively form the reduced portion 2a, the enlarged portion 2b, the necked portion 2c, the shoulder portion 2d and the body 2e. The crystal-clamping fixture 30 is suspended by three fixture-pulling up wires 8, 9, 10, which are wound up in synchrony with the crystal pulling up wire 3 when the holding rods 32 of the crystal-clamping fixture 30 have clamped the single crystal 2. Furthermore, in FIG. 1, the fixture-pulling up wire 10 is at a location overlapping with that of the crystal pulling up wire 3, and the holding rods 32 of the crystal-clamping fixture 30 are in contact with the conic surface formed between the enlarged portion 2b and the necked portion 2c so as to clamp the single crystal 2.

FIG. 2 is a perspective view showing the structure of a first embodiment of the crystal-clamping fixture according to this invention. FIG. 3 is a partial cross-sectional view showing the structure of the upper portion of the crystal-clamping fixture according to this invention. FIGS. 4a, 4b and 4c are perspective views showing the shapes of the collars affixed on the holding rods. As shown in FIG. 2, the crystal-clamping fixture 30 comprises a hexahedral box 31 and two holding rods 32, 32. The box 31 is made of metals with high melting points, such as Molybdenum, and two "S" shaped slots 31a, 31b are respectively formed in the opposing two vertical sidewalls of the box 31. Each of the holding rods 32, 32 is supported at its two ends by the "S" shaped slots 31a, 31b and is capable of rotating along the "S" shaped slot 31a or 31b without restraint. Upper pockets and lower pockets for firmly retaining the holding rods 32, 32 are respectively formed at the upper ends and the lower ends of the "S" shaped slots 31a, 31b. The holding rods 32, 32 shown in FIG. 2 are firmly retained at the upper pockets.

Two openings 31c through which the enlarged portion of a single crystal can easily pass are respectively formed in the top wall and bottom wall of the box 31. For the purpose of easily taking the balance of the crystal-clamping fixture 30 during clamping the single crystal, connection between the box 31 and the fixture-pulling up wires 8, 9, 10 is achieved by the ball seats 33 affixed on the top wall of the box 31 and the balls 11 accommodated in the ball seats 33 and affixed at the lower ends of the fixture-pulling up wires 8, 9, 10. Furthermore, it is also satisfactory to make the opening 31c formed on the top wall of the box 31 smaller than that formed on the bottom wall of the box 31 so as to secure the installation space of the ball seats 33.

As shown in FIG. 2, positioning collars 34 in contact with the outside surfaces of the box 31 are installed at the ends of the holding rods 32. The positioning collars 34 are used for preventing any change in the axial directions of the holding rods 32. Although the outside surfaces of the box 31 are also employed as positioning means on the box side (see FIG. 2), it is also advisable to form outward-protruding positioning bosses extending along the "S" shaped slots 31a, 31b on the outside surfaces of the box 31. As shown in FIG. 4a, a collar 35 having radial protrusions formed on its outer periphery is affixed on the middle portion of the holding rod 32. The collar 35 is in contact with the conic surface formed between the enlarged portion and the necked portion to clamp the single crystal. However, the shape of the collar 35 is not limited to that described above. It can also be in the shape of a cylinder (see FIG. 4b) or sphere (see FIG. 4c). The holding rods 32, the positioning collars 34, and the collars 35 are made of carbon-reinforced type carbon fibers. Furthermore, it is also acceptable to directly contact the conic surface formed between the enlarged portion and the necked portion with the holding rods 32 without collars 35 being affixed thereon.

FIG. 5 is a perspective view showing the structure of a second embodiment of the crystal-clamping fixture. As shown in FIG. 5, a crystal-clamping fixture 40 is provided with a box 41 shaped like an irregular hexagonal prism whose top side and bottom side are respectively in the shape of an equilateral triangle with its three angled corners removed. Three holding rods 42, 42, 42 clamp the conic surface formed between the enlarged portion and the necked portion in three different directions. Two "S" shaped slots 41a, 41b are formed in each of three vertical sides of the box 41 and a dissimilar vertical side is interposed between every pair of the three separated vertical sides. Each of the holding rods 42 is supported at its two ends by the "S" shaped slots 41a, 41b and is capable of rotating along the "S" shaped slot 41a or 41b without restraint. The three holding rods 42, 42, 42 shown in FIG. 5 are firmly retained at the lower pockets formed at the lower ends of the "S" shaped slots 41a, 41b. Two openings 41c through which the enlarged portion of a single crystal can easily pass are respectively formed in the top wall and bottom wall of the box 41. The same as the crystal-clamping fixture of the first embodiment shown in FIG. 2, connection between the box 41 and the fixture-pulling up wires 8, 9, 10 is performed by three ball seats 43 affixed on the top wall of the box 41 and balls accommodated within the three ball seats 43 that are affixed at the lower ends of the fixture-pulling up wires 8, 9, 10.

FIGS. 6a and 6b are partial cross-sectional views showing the methods for supporting the holding rods 42 by the crystal-clamping fixture 40 shown in FIG. 5. Both methods shown in FIGS. 6a and 6b are acceptable. As shown in FIG. 6a, protrusions 41d, 41d having two inward opposing parallel surfaces and extending along the "S" shaped slots 41a, 41b to the entire length thereof are formed within the box 41 so as to be employed as positioning means of the holding rod 42; and two positioning collars 44, 44 affixed at the two ends of the holding rod 42 and respectively in contact with the above parallel surfaces are used to prevent the change in axial direction of the holding rod 42. Furthermore, as with the crystal-clamping fixture of the first embodiment, a collar 45 is affixed at the middle portion of the holding rod 42. As shown in FIG. 6b, protrusions 41e, 41e having two parallel surfaces are formed at the outside of the box 41; and two positioning collars 44, 44 in contact with the above parallel surfaces of the protrusions 41e, 41e are used to prevent the change in axial direction of the holding rod 42. In addition, the collar 45 affixed at the middle portion of the holding rod 42 is cylindrical in shape.

FIG. 7 is a schematic cross-sectional view showing an outline structure of a pulling up mechanism according to this invention. As shown in FIG. 7, a pulling up mechanism 1 comprises a crystal winding-up drum 13 driven to rotate by a crystal winding-up motor 12; three fixture winding-up drums 15, 16, 17 driven to rotate by a fixture winding-up motor 14; and a pulley 18. The pulling up mechanism 1 is driven to rotate in a horizontal plane by a crystal/fixture rotation motor 20 via a belt 19. The upper end of the single-crystal pulling up wire 3 is affixed on the crystal winding-up drum 13, and the upper ends of the three fixture-pulling up wires 8, 9, 10 are respectively affixed on the three fixture winding-up drums 15, 16, 17. Two urging members 21, 22 are installed respectively upon the upper sides and beneath the lower sides of the three fixture winding-up drums 15, 16, 17 to prevent any sagging of the three fixture-pulling up wires 8, 9, 10.

FIG. 8 is a top view showing the structure of the fixture winding-up drums 15, 16, and 17 for pulling up the crystal-clamping fixture. FIG. 9a is a side view along the Z arrow of FIG. 8, showing the structure of the fixture winding-up drums 15, 17. FIG. 9b is a side view along the Z arrow of FIG. 8, showing the structure of the fixture winding-up drum 16. The fixture winding-up drums 15, 16, 17 are disposed in alignment with the axis of the fixture winding-up motor 14, and the three fixture-pulling up wires 8, 9, 10 are respectively connected to the crystal-clamping fixture by gay of the pulleys 23, 24, 25.

In this embodiment, three fixture-pulling up wires suspend the crystal-clamping fixture, and three fixture winding-up dons, which are driven by a fixture winding-up motor, wind the three fixture-pulling up wires. However, it is not limited to the above structure. It is also acceptable to connect each fixture winding-up drum with a fixture winding-up motor and to drive all fixture winding-up motors synchronically.

Figure 10A:
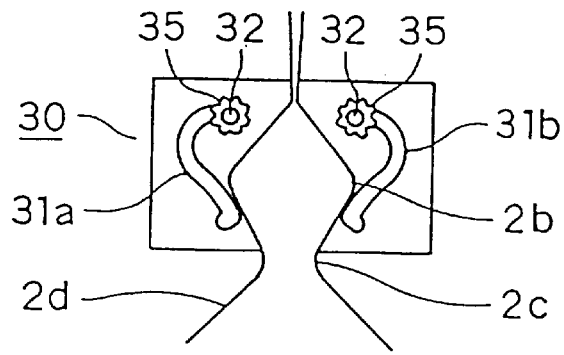
FIG. 10a is a schematic drawing showing the operation of the crystal-clamping fixture according to this invention, wherein the holding rods are kept stationary.
Figure 10B:
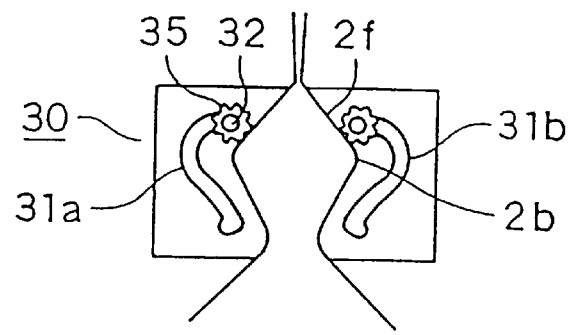
FIG. 10b is a schematic drawing showing the operation of the crystal-clamping fixture according to this invention, wherein the holding rods are in contact with the single crystal.

The following is a description of the method for pulling up single crystals in accordance with this invention, wherein a single-crystal pulling up apparatus provided with the crystal-clamping fixture 30 shown in FIG. 2 is taken as an illustrative example. Furthermore, the method for pulling up single crystals, employing the crystal-clamping fixture 40 shown in FIG. 5, is the same as that employing the crystal-clamping fixture 30 shown in FIG. 2. In the process of pulling up single crystals, as shown in FIG. 1, after the seed crystal 5 installed within the seed holder 4 has been dipped into and has adapted itself to the melt 7, the seed crystal 5 is pulled up to form the reduced portion 2a, the enlarged portion 2b, the necked portion 2c, and the shoulder portion 2d. During the above process, the crystal-clamping fixture 30 is kept waiting at a location above the seed holder 4, and the holding rods 32, 32 are at the state of being firmly retained at the upper pockets formed at the upper ends of the "S" shaped slots 31a, 31b. After the shoulder portion 2d of the single crystal has been formed following the formation of the necked portion 2c, the enlarged portion 2b ascends and enters the crystal-clamping fixture 30 (see FIG. 10a). At the time the enlarged portion 2b further ascends or the fixture winding-up motor drives the crystal-clamping fixture 30 to descend a small distance, the collars 35, 35 of the holding rods 32, 32 contact with the conic surface 2f formed at the upper part of the enlarged portion 2b (see FIG. 10b).

Figure 10C:
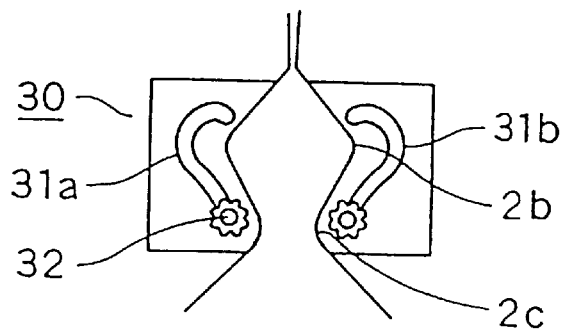
FIG. 10c is a schematic drawing showing the operation of the crystal-clamping fixture according to this invention, herein the holding rods are lowered to their lowermost locations.
Figure 10D:
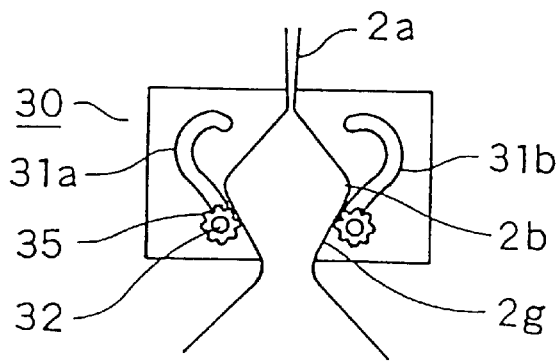
FIG. 10d is a schematic drawing showing the operation of the crystal-clamping fixture according to this invention, wherein the holding rods are holding the single crystal.
Figure 11:
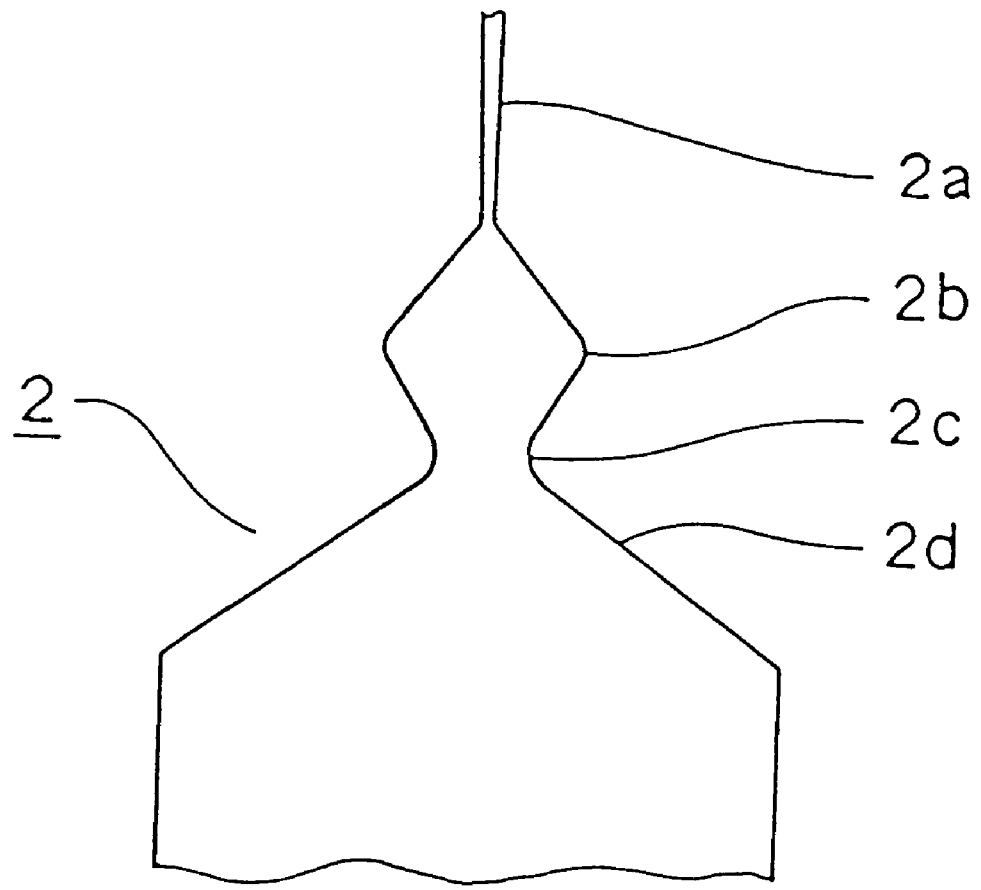
FIG. 11 is a schematic drawing showing that a necked portion used for engaging with holding rods is formed between a reduced portion and a shoulder of a single crystal.

At the time the collars 35, 35 of the holding rods 32, 32 contact the conic surface 2f formed at the upper part of the enlarged portion 2b, an upward force and an outward horizontal force are exerted on the collars 35, 35. Therefore, the holding rods 32, 32 are pushed out from the upper pockets formed at the upper ends of the "S" shaped slots 31a, 31b. Then, the holding rods 32, 32 rotate and descend along the "S" shaped slots 31a, 31b by their own weight and reach the lower pockets formed at the lower ends of the "S" shaped slots 31a, 31b without interfering with the enlarged portion 2b or the necked portion 2c. (see FIG. 10c). Then, the fixture winding-up motor drives the crystal-clamping fixture 30 to ascend a small distance. By this, the collars 35, 35 of the holding rods 32, 32 are directed to contact with the conic surface 2g formed below the enlarged portion 2b (see FIG. 10d), and an downward force and an outward horizontal force are exerted on the holding rods 32, 32. Therefore, the holding rods 32, 32 are pushed into the lower pockets formed at the lower ends of the "S" shaped slots 31a, 31b, and the weight of the single crystal is supported by the holding rods 32, 32. The weight supported by the holding rods 32, 32 is obtained by subtracting the weight supported by the necked portion 2a from the total weight of the single crystal.

As described above, in the process of pulling up single crystals by the CZ method, a crystal-clamping fixture suspended within the single-crystal manufacturing apparatus is provided with a space capable of accommodating the enlarged portion and the necked portion formed beneath the reduced portion, and the necked portion is clamped by a plurality of holding rods installed within the crystal-clamping fixture. Therefore, compared with conventional crystal-clamping mechanisms, the crystal-clamping fixture according to this invention is smaller. In particular, the length of the crystal-clamping fixture in the vertical direction is short, therefore the crystal-clamping fixture will not restrain the length of the crystal pulled up in the vertical direction. Furthermore, the structure of the crystal-clamping fixture is simple without any distinct driving means installed therein. The single crystal canx be firmly clamped by the crystal-clamping fixture of this invention, and dropping of the single crystal will not happen during the pulling up process. In addition, the crystal-clamping fixture operates easily. In light of the above, the apparatus for pulling up single crystals of this invention is entirely able to respond to the enlargement of single-crystal diameters or lengths.

What is claimed is:

1. An apparatus for pulling up single crystals comprising:
a crystal-clamping fixture including a box and a plurality of holding rods; the box having two openings formed respectively on its top and bottom sides, "S" shaped slots formed on its lateral sides, and a pulling up/lowering means; each of the holding rods being horizontally disposed within the box by inserting their two end portions through the "S" shaped slots in a manner capable of rotating along the path of the "S" shaped slots.

2. An apparatus for pulling up single crystals as claimed in claim 1, wherein the paths of the "S" shaped slots are designed in a manner that holding rods will not interfere with a enlarged portion and a reduced diameter portion as a necked portion of the single crystal being pulled up when the holding rods descend along the paths, and each path connects to an upper pocket where a holding rod is kept stationary, and a lower pocket where a holding rod clamps the single crystal being pulled up.

3. An apparatus for pulling up single crystals as claimed in claim 1, wherein the box and holding rods are provided with positioning means for positioning the holding rods with respect to the box so that the holding rods are kept at a horizontal attitude and the difference in axial directions are prevented.

4. An apparatus for pulling up single crystals as claimed in claim 1, wherein the holding rods are provided with collars affixed on the middle portions of the holding rods, said collars being one of a cylindrical shape, a spherical shape and a shape with radial protrusions; the collars being used for connecting and clamping the single crystal being pulled up at a conic surface formed between an enlarged portion and a necked portion of the single crystal.

5. An apparatus for pulling up single crystals as claimed in claim 1, wherein the pulling up/lowering means is connected with the box through a connecting portion having spherical surface slidably.

6. An apparatus for pulling up single crystals as claimed in claim 5, wherein the pulling up/lowering means is connected with the box by three ball seats affixed on the top wall of the box and balls accommodated within the three ball seats that are affixed at the lower ends of the fixture-pulling up wires as the pulling up/lowering means.

7. A method of pulling up single crystals characterized in that:

in the process of manufacturing semiconductor single crystals by the CZ method, subsequent to the dipping a seed crystal into the melt to form a reduced portion, an enlarged portion and a necked portion are consecutively formed, then a plurality of holding rods kept at the upper ends of the "S" shaped slots are pushed downward to contact the conic surface formed at the upper part of the enlarged portion, after the holding rods have moved to the lower ends of the "S" shaped slots the holding rods are directed to contact the conic surface formed between the enlarged portion and the necked portion of the single crystal by raising the crystal-clamping fixture.

* * * * *